United States Patent
Fujii

(10) Patent No.: US 10,763,760 B2
(45) Date of Patent: Sep. 1, 2020

(54) SEMICONDUCTOR DEVICE AND POWER CONVERTER

(71) Applicant: Mitsubishi Electric Corporation, Tokyo (JP)

(72) Inventor: Hidenori Fujii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/216,746

(22) Filed: Dec. 11, 2018

(65) Prior Publication Data

US 2019/0280613 A1 Sep. 12, 2019

(30) Foreign Application Priority Data

Mar. 8, 2018 (JP) ................. 2018-041442

(51) Int. Cl.
*H01L 29/06* (2006.01)
*H01L 29/417* (2006.01)
*H02M 7/155* (2006.01)

(52) U.S. Cl.
CPC ...... *H02M 7/1555* (2013.01); *H01L 29/0615* (2013.01); *H01L 29/41716* (2013.01)

(58) Field of Classification Search
None
See application file for complete search history.

(56) References Cited

U.S. PATENT DOCUMENTS

| 5,977,611 A * | 11/1999 | Sittig ............. H01L 29/864 257/603 |
| 7,800,204 B2 | 9/2010 | Fujii |
| 2009/0267200 A1* | 10/2009 | Gutt ............. H01L 21/26513 257/655 |
| 2018/0053655 A1 | 2/2018 | Kawase |

FOREIGN PATENT DOCUMENTS

JP 5309360 B2 10/2013
WO 2016/203545 A1 12/2016

* cited by examiner

*Primary Examiner* — Robert K Carpenter
(74) *Attorney, Agent, or Firm* — Studebaker & Brackett PC

(57) ABSTRACT

Provided is a technique for preventing a peak current during recovery while enhancing breakdown voltage. A semiconductor device includes the following: a p⁻-type anode layer having a uniform p-type impurity concentration; an n⁻-type layer having a distributed n-type impurity concentration; and an n⁺-type layer disposed with the n⁻-type layer interposed between the n⁺-type layer and the p⁻-type anode layer, the n⁺-type layer having an n-type impurity concentration that is higher than that of the n⁻-type layer and is uniform. The n-type impurity concentration of the n⁻-type layer in a portion on the p⁻-type-anode-layer side is lower than the p-type impurity concentration of the p⁻-type anode layer.

12 Claims, 9 Drawing Sheets

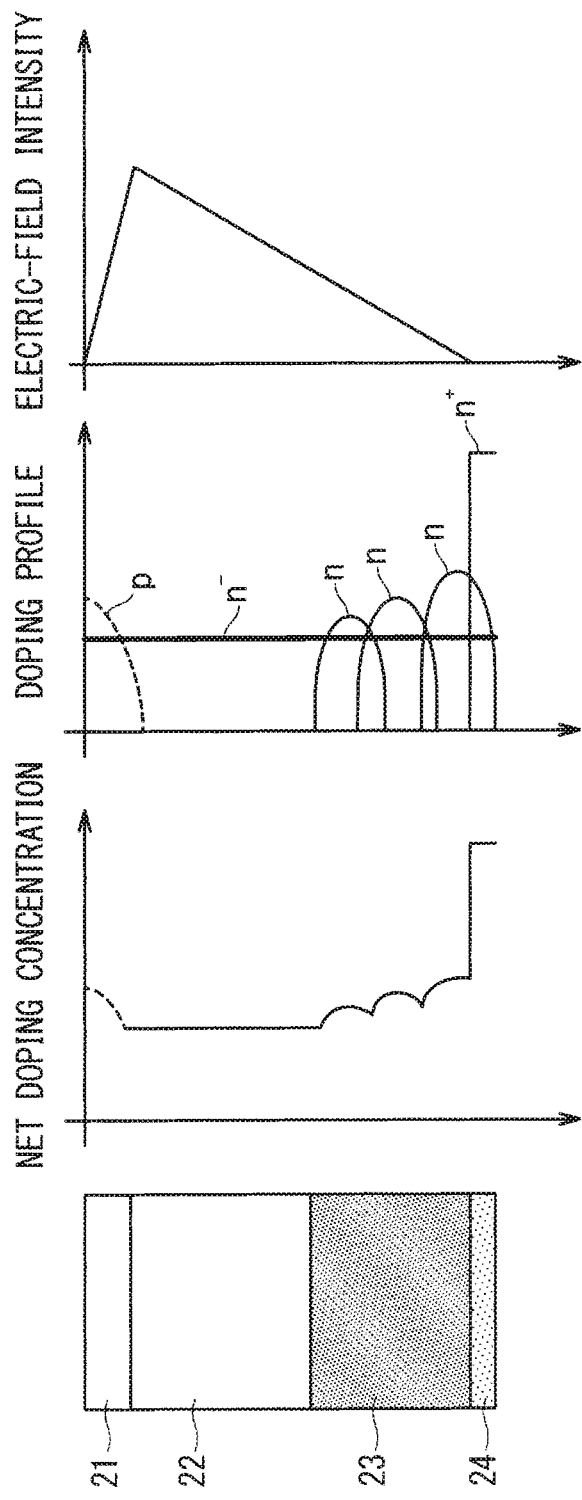

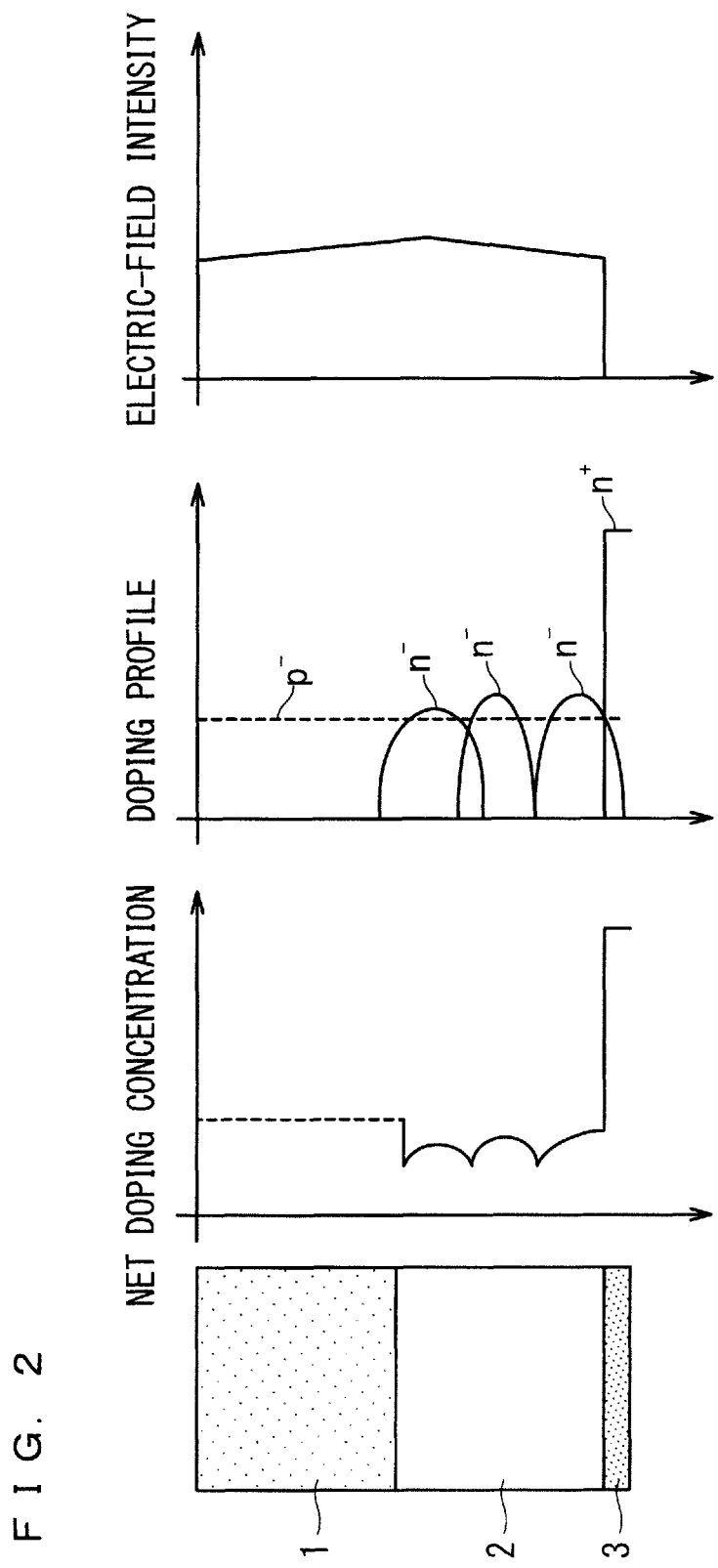
F I G. 2

F I G. 6
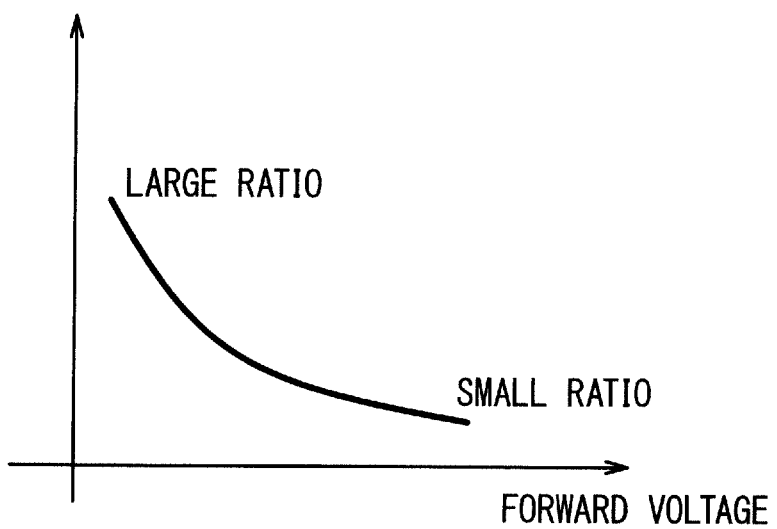

F I G. 8
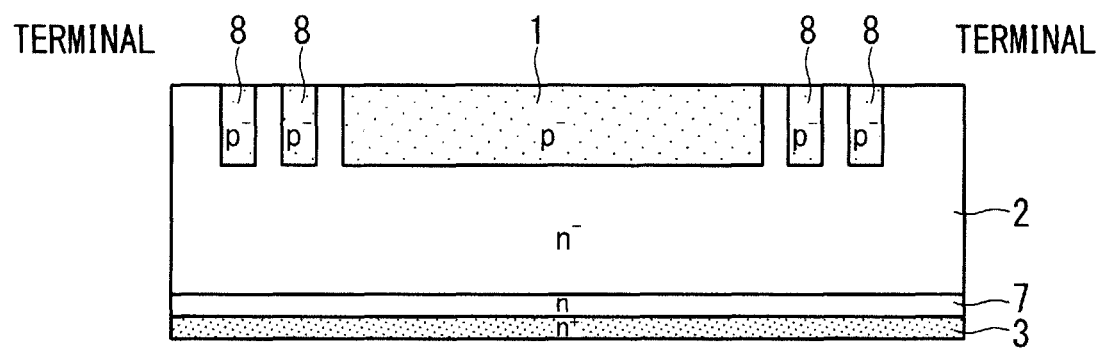
F I G. 9
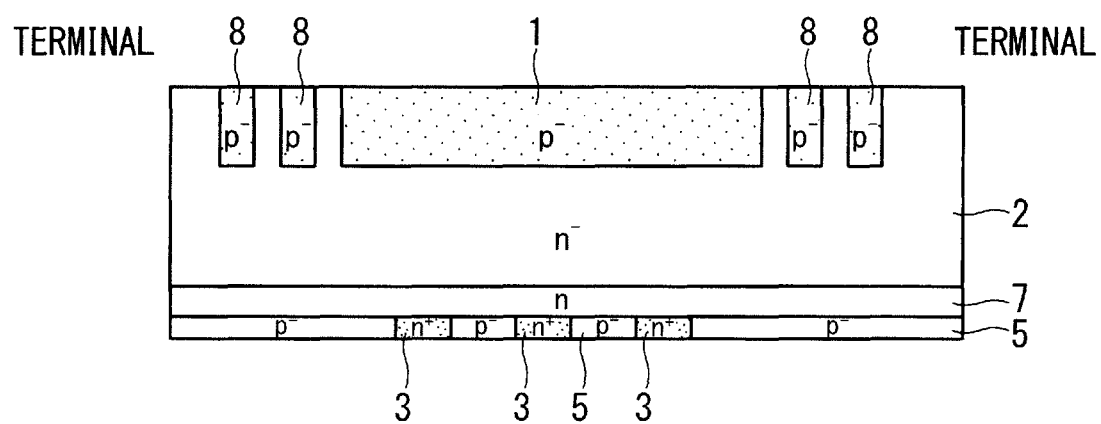

F I G. 1 0
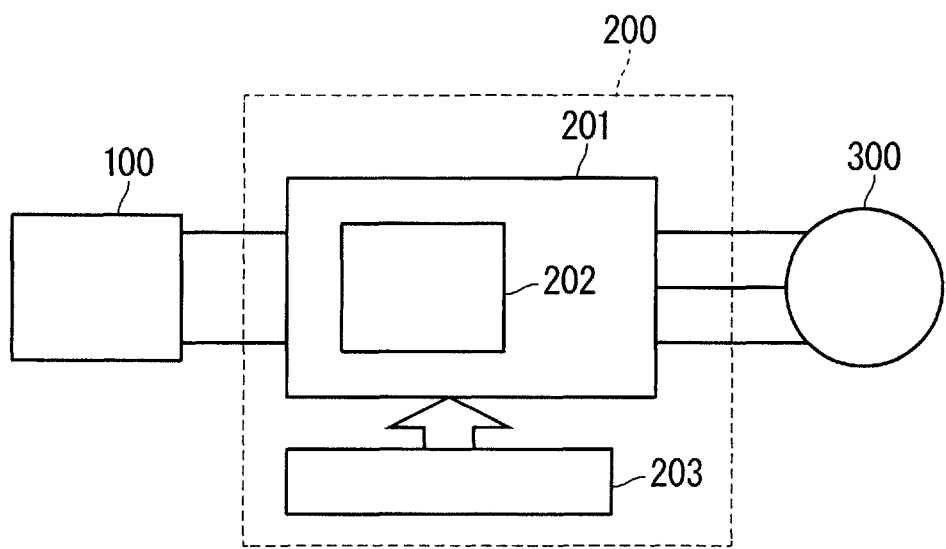

SEMICONDUCTOR DEVICE AND POWER CONVERTER

BACKGROUND OF THE INVENTION

Field of the Invention

The present invention relates to semiconductor devices including anode layers.

Description of the Background Art

To improve the performance of power semiconductor devices, a mainstream structure in recent years includes a back-surface diffusion layer formed by thinly grinding a wafer substrate and then diffusing impurities from the back surface of the wafer substrate. In one example, International Publication No. 2016/203545 discloses a technique of forming a p-type anode layer onto an n-type substrate having a uniform n-type impurity concentration through p-type impurity injection and thermal diffusion, followed by grinding a wafer substrate to have a desired thickness and injecting protons from the back surface of the wafer substrate, to thus form an n-type buffer layer. In another example, Japanese Patent No. 5309360 discloses a technique of forming an $n^+$ layer that has a relatively high n-type impurity concentration onto the outermost back surface of a wafer substrate.

For breakdown voltage enhancement, these techniques require the p-type anode layer to have a high concentration, and a depletion layer to extend from the p-type anode layer toward the $n^-$-type substrate. Such a configuration unfortunately involves a relatively large peak current during recovery.

SUMMARY

To solve this problem, it is an object of the present invention to provide a technique for preventing a peak current during recovery while enhancing breakdown voltage.

A semiconductor device in the present invention includes the following: an anode layer having a p-type impurity concentration that is uniform; a first semiconductor layer having an n-type impurity concentration that is distributed; and a second semiconductor layer disposed with the first semiconductor layer interposed between the second semiconductor layer and the anode layer, the second semiconductor layer having an n-type impurity concentration that is higher than that of the first semiconductor layer and is uniform. The n-type impurity concentration of the first semiconductor layer in a portion on an anode-layer side is lower than the p-type impurity concentration of the anode layer.

Such a semiconductor device prevents the peak current during recovery while enhancing the breakdown voltage.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of the configuration of a related semiconductor device;

FIG. 2 is a cross-sectional view of the configuration of a semiconductor device according to a first preferred embodiment;

FIG. 6 is a diagram for describing the characteristics of the semiconductor device according to the fourth preferred embodiment;

FIG. 8 is a cross-sectional view of the configuration of a semiconductor device according to a sixth preferred embodiment;

FIG. 9 is a cross-sectional view of the configuration of a semiconductor device according to a seventh preferred embodiment; and FIG. 10 is a block diagram of the configuration of a power conversion system including a power converter according to an eighth preferred embodiment.

DESCRIPTION OF THE PREFERRED EMBODIMENTS

<Related Semiconductor Device>

Figure 3:
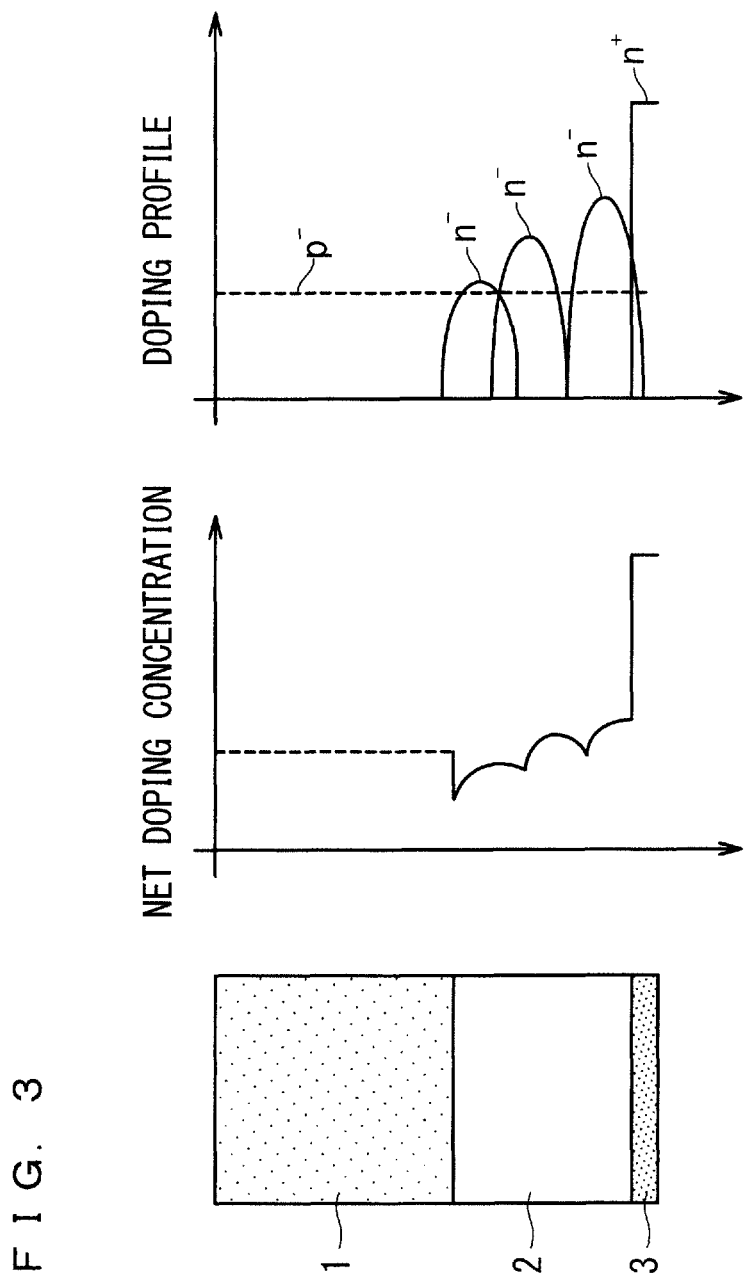
FIG. 3 is a cross-sectional view of the configuration of a semiconductor device according to a second preferred embodiment.

Prior to semiconductor devices according to preferred embodiments of the present invention, the following describes a semiconductor device (hereinafter, referred to as a "related semiconductor device") that relates to these semiconductor devices.

FIG. 1 illustrates the cross-sectional configuration of the related semiconductor device, and illustrates corresponding net doping concentration, corresponding doping profile, and corresponding electric-field intensity. The net doping concentration is effective concentration that is equivalent to the difference between practical n-type impurity concentration and practical p-type impurity concentration.

The related semiconductor device in FIG. 1 includes a p-type anode layer 21, an $n^-$-type layer 22, an n-type layer 23, and an $n^+$-type layer 24. The related semiconductor device is formed by grinding, as necessary, an $n^-$-type substrate that has a uniform n-type impurity concentration, and selectively forming the p-type anode layer 21, the n-type layer 23, and the $n^+$-type layer 24 through impurity diffusion, and by defining the remaining part of the $n^-$-type substrate as the $n^-$-type layer 22. In such a configuration, the p-type anode layer 21 needs to have a high concentration so that a depletion layer extends from the p-type anode layer 21 toward the $n^-$-type layer 22. Such a configuration unfortunately involves a relatively large peak current during recovery. The following semiconductor devices according to the preferred embodiments of the present invention solve this problem.

First Preferred Embodiment

FIG. 2 illustrates the cross-sectional configuration of a semiconductor device according to a first preferred embodiment of the present invention, and illustrates corresponding net doping concentration, corresponding doping profile, and corresponding electric-field intensity. Examples of the semiconductor device in FIG. 2 include a relaxed field of cathode (RFC) diode and a reverse-conducting insulated-gate bipolar transistor (RC-IGBT).

The semiconductor device in FIG. 2 includes a p⁻-type anode layer 1, which is an anode layer, an n⁻-type layer 2, which is a first semiconductor layer, and an n⁺-type layer 3, which is a second semiconductor layer. In the first preferred embodiment, the p⁻-type anode layer 1 is disposed on the front surface side of a semiconductor substrate; moreover, the n⁺-type layer 3 is disposed on the back surface side of the semiconductor substrate. The semiconductor substrate is made of, for instance, silicon (Si). Alternatively, the semiconductor substrate is formed of, for instance, a wide-bandgap semiconductor made of a material, such as silicon carbide (SiC), gallium nitride (GaN), or diamond. Further, these individual layers can be called regions.

Hereinafter, n-type impurity concentration and p-type impurity concentration are both net doping concentration unless explicitly described as practical impurity concentration.

The p⁻-type anode layer 1 has a uniform p-type impurity concentration. The n⁻-type layer 2 has a distributed n-type impurity concentration. To be specific, the n-type impurity concentration of the n⁻-type layer 2 in a portion on the p⁻-type-anode-layer-1 side is lower than the p-type impurity concentration of the p⁻-type anode layer 1. In the first preferred embodiment, the n-type impurity concentration of the entire n⁻-type layer 2 is lower than the p-type impurity concentration of the p⁻-type anode layer 1.

The n⁺-type layer 3 is disposed with the n⁻-type layer 2 interposed between the n⁺-type layer 3 and the p⁻-type anode layer 1. The n⁺-type layer 3 has an n-type impurity concentration that is higher than that of the n⁻-type layer 2 and is uniform.

The following describes one example of a method for manufacturing the semiconductor device according to the first preferred embodiment.

Firstly, the semiconductor substrate is prepared whose practical p-type impurity concentration is uniform. The semiconductor substrate is then grinded to have a desired thickness. After that, the semiconductor substrate is injected or irradiated with protons or electronic beams at a maximum energy level of about 10 MeV, and is then heated at 350 to 500° C. for 30 to 300 minutes. A donor-containing layer is formed at a relatively deep portion of the semiconductor substrate. Here, the practical n-type impurity concentration of the donor-containing layer is set so as to cancel the practical p-type impurity concentration of the semiconductor substrate. As a result, the n⁻-type layer 2 is formed that has an n-type net doping concentration lower than the p-type net doping concentration of the semiconductor substrate. Furthermore, the semiconductor substrate contains no donor in a portion that is on the front surface side of the semiconductor with respect to the n⁻-type layer 2. This portion is the p⁻-type anode layer 1. After that, the semiconductor substrate is injected with phosphorus ions on its entire back surface at 1E14 to 1E17 [1/cm²], and is then heated. This forms the n⁺-type layer 3 having a uniform concentration. At this stage, the net doping concentration of the p⁻-type anode layer 1 is, for instance, $1 \times 10^{12}$ to $1 \times 10^{14}$ [1/cm³]; moreover, the net doping concentration of the n⁺-type layer 3 is, for instance, $1 \times 10^{18}$ to $1 \times 10^{20}$ [1/cm³].

The semiconductor device according to the first preferred embodiment includes the p⁻-type anode layer 1 having a uniform p-type impurity concentration, and the n⁻-type layer 2 having a concentration whose gradient is relatively gentle. Such a configuration enables a pn junction between the p⁻-type anode layer 1 and the n⁻-type layer 2 to be located in a position deep from the front and back surfaces of the semiconductor substrate (e.g., in about the middle in the depth direction of the semiconductor device in FIG. 2). This reduces hole injection from the p⁻-type anode layer 1 to the n⁻-type layer 2, and by extension, lowers a peak current Irr during recovery while enhancing breakdown voltage. In addition, the n⁻-type layer 2, which has a regulated concentration gradient, enables the adjustment of recovery properties. In addition, the n⁺-type layer 3, which has a high and uniform n-type impurity concentration, prevents unnecessary extension of the depletion layer during recovery, and also lowers the resistance of an ohmic contact.

Second Preferred Embodiment

FIG. 3 illustrates the cross-sectional configuration of a semiconductor device according to a second preferred embodiment of the present invention, and illustrates corresponding net doping concentration and corresponding doping profile. Identical or similar components between the second preferred embodiment and the forgoing preferred embodiment are denoted by the same reference sings. Mainly described are different components between these preferred embodiments.

In the second preferred embodiment, the n-type impurity concentration of the n⁻-type layer 2 in a portion on the n⁺-type-layer-3 side is higher than the p-type impurity concentration of the p⁻-type anode layer 1. Moreover, the n-type impurity concentration of the n⁻-type layer 2 has such a gradient as to increase, on the whole, from the p⁻-type anode layer 1 toward the n⁺-type layer 3.

The semiconductor device according to the second preferred embodiment achieves an effect similar to that in the first preferred embodiment. In addition, the n⁻-type layer 2, which has a gradient n-type impurity concentration, prevents unnecessary extension of the depletion layer during recovery. This prevents an oscillation resulting from an excessively rapid speed of switching during recovery, thus enhancing oscillation strength.

Third Preferred Embodiment

Figure 4:
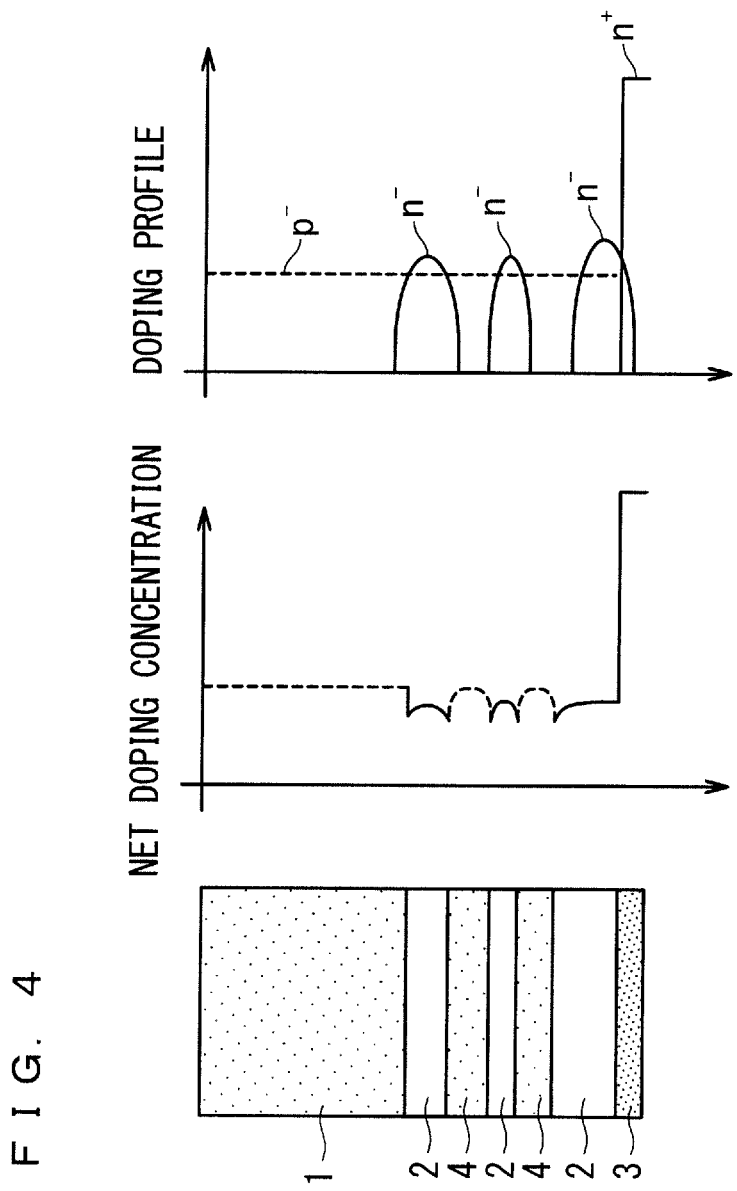
FIG. 4 is a cross-sectional view of the configuration of a semiconductor device according to a third preferred embodiment.

FIG. 4 illustrates the cross-sectional configuration of a semiconductor device according to a fourth preferred embodiment of the present invention, and illustrates corresponding net doping concentration and corresponding doping profile. Identical or similar components between the third preferred embodiment and the forgoing preferred embodiments are denoted by the same reference sings. Mainly described are different components between these preferred embodiments.

The semiconductor device in the third preferred embodiment includes a p⁻-type layer 4, which is a third semiconductor layer, in addition to the configuration of the semiconductor device in the first preferred embodiment. The p⁻-type layer 4, similarly to the p⁻-type anode layer 1, has a uniform p-type impurity concentration. The p⁻-type layer 4 is disposed within the n⁻-type layer 2 so as to divide the n⁻-type layer 2 into a portion on the p⁻-type-anode-layer-1 side and a portion on the n⁺-type-layer-3 side. Moreover, the p⁻-type layer 4 has a floating potential. It is noted that a single p⁻-type layer 4 may be provided; alternatively, a plurality of p⁻-type layers 4 are provided as illustrated in FIG. 4.

The semiconductor device according to the third preferred embodiment achieves an effect similar to that in the first preferred embodiment. The p⁻-type layer 4 in the third preferred embodiment, which has a floating potential, enables the regulation of time and speed necessary for depletion during recovery.

Fourth Preferred Embodiment

Figure 5:
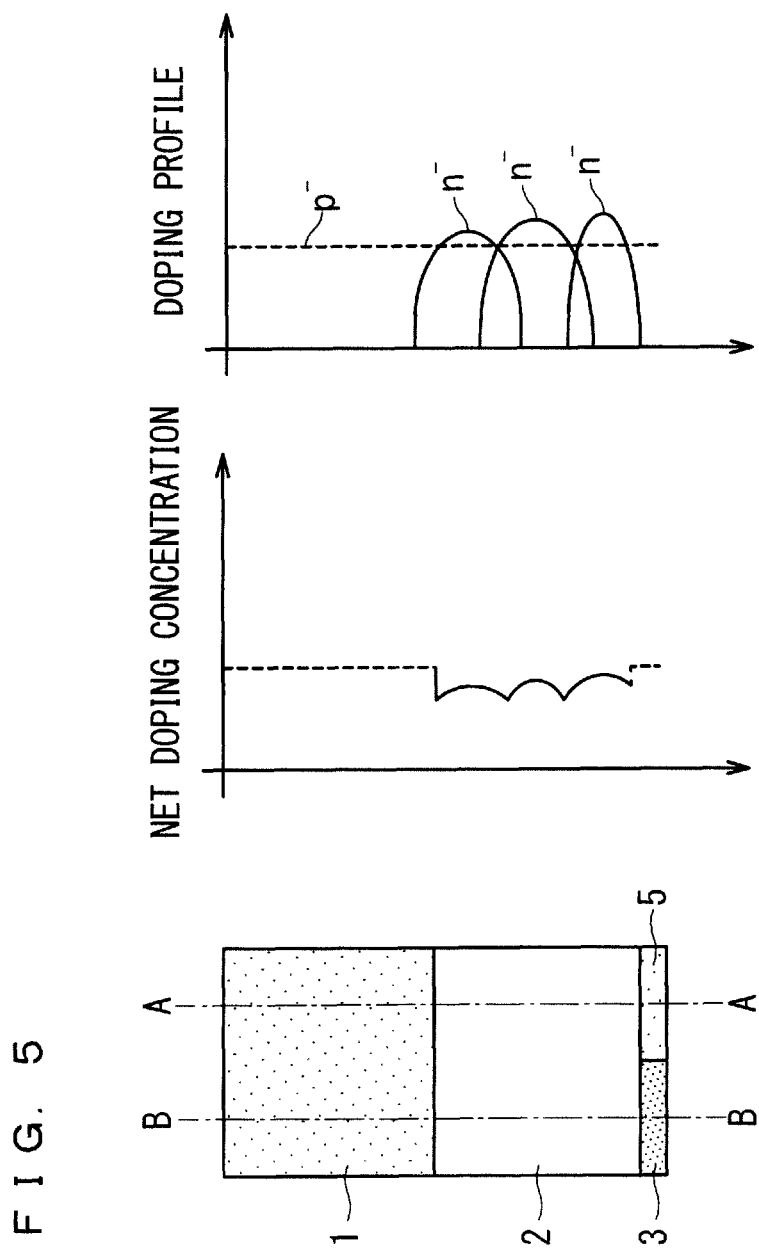
FIG. 5 is a cross-sectional view of the configuration of a semiconductor device according to a fourth preferred embodiment.

FIG. 5 illustrates the cross-sectional configuration of a semiconductor device according to a fourth preferred embodiment of the present invention, and illustrates corresponding net doping concentration and corresponding doping profile. Identical or similar components between the fourth preferred embodiment and the forgoing preferred embodiments are denoted by the same reference sings. Mainly described are different components between these preferred embodiments. The net doping concentration and doping profile in FIG. 5 are the net doping concentration and doping profile of a cross-section taken along line A-A. The net doping concentration and doping profile of a cross-section taken along line B-B are similar to those in the first preferred embodiment and other preferred embodiments.

The semiconductor device in the fourth preferred embodiment includes a p⁻-type layer 5, which is the third semiconductor layer, in addition to the configuration of the semiconductor device in the first preferred embodiment. The p⁻-type layer 5 is disposed on the same side of the n⁻-type layer 2 as the n⁺-type layer 3, and is adjoining to the n⁺-type layer 3. The p⁻-type layer 5, similarly to the p⁻-type anode layer 1, has a uniform p-type impurity concentration.

The semiconductor device according to the fourth preferred embodiment achieves an effect similar to that in the first preferred embodiment. In addition, holes are injected from the back surface of the semiconductor substrate when the depletion layer reaches near the back surface during recovery. This enhances the oscillation strength. In addition, regulating the ratio of the area of the n⁺-type layer 3 to a total area (the area of the n⁺-type layer 3 and the area of the p⁻-type layer 5) as shown in FIG. 6 achieves a semiconductor device having a balance between power loss during recovery and the level of forward voltage VF.

Fifth Preferred Embodiment

Figure 7:
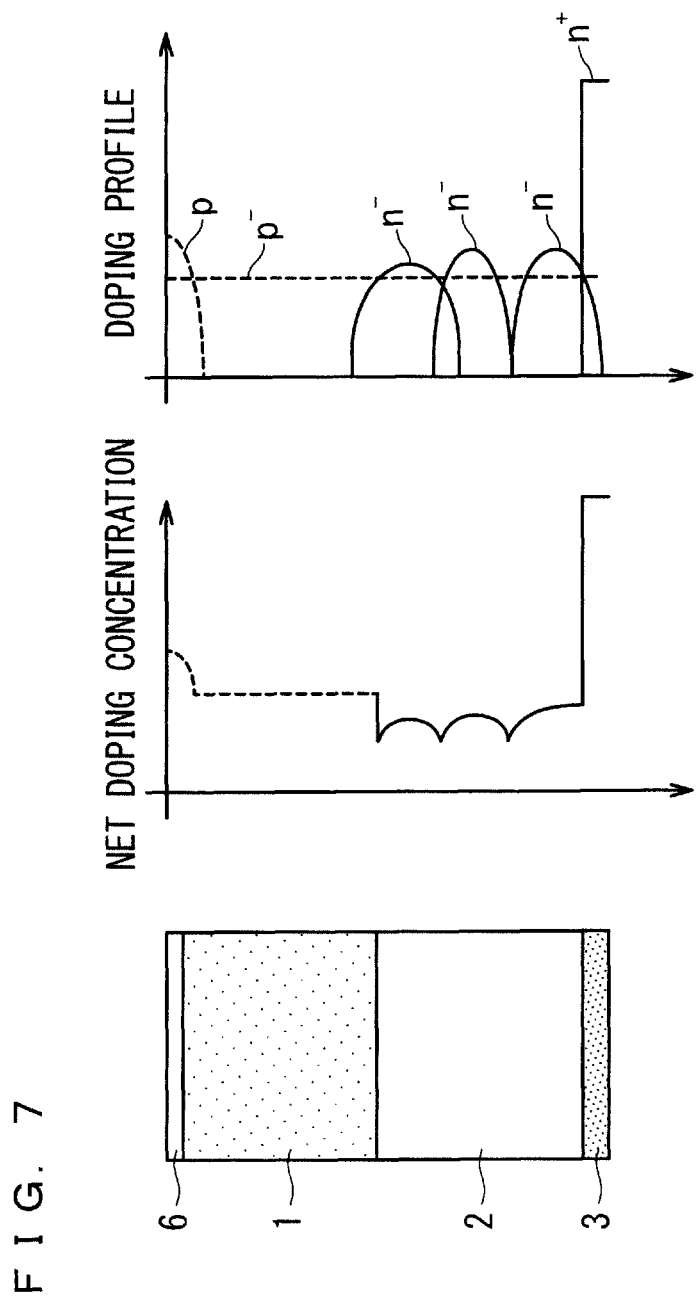
FIG. 7 is a cross-sectional view of the configuration of a semiconductor device according to a fifth preferred embodiment.

FIG. 7 illustrates the cross-sectional configuration of a semiconductor device according to a fifth preferred embodiment of the present invention, and illustrates corresponding net doping concentration and corresponding doping profile. Identical or similar components between the fifth preferred embodiment and the forgoing preferred embodiments are denoted by the same reference sings. Mainly described are different components between these preferred embodiments.

The semiconductor device in the fifth preferred embodiment includes a p-type layer 6, which is a fourth semiconductor layer, in addition to the configuration of the semiconductor device in the first preferred embodiment. The p-type layer 6 is disposed on the opposite side of the p⁻-type anode layer 1 from the n⁻-type layer 2. The p-type layer 6 has a p-type impurity concentration that is higher than that of the p⁻-type anode layer 1 and is distributed. To be specific, the p-type impurity concentration of the p-type layer 6 has such a gradient as to increasingly approach the p-type impurity concentration of the p⁻-type anode layer 1 toward the p⁻-type anode layer 1. The p-type layer 6 has a maximum net doping concentration ranging, for instance, from $1 \times 10^1$ to $1 \times 10^{18}$ [1/cm³]. Moreover, the n⁺-type layer 3 has a net doping concentration ranging, for instance, from $1 \times 10^{18}$ to $1 \times 10^{20}$ [1/cm³]. The p-type layer 6 is 3 μm or less deep, for instance. Moreover, the n⁺-type layer 3 is 1 μm or less deep, for instance.

The semiconductor device according to the fifth preferred embodiment achieves an effect similar to that in the first preferred embodiment. The semiconductor device according to the fifth preferred embodiment also reduces the resistance of an ohmic contact with the front surface of the semiconductor substrate.

Sixth Preferred Embodiment

FIG. 8 illustrates the cross-sectional configuration of a semiconductor device according to a sixth preferred embodiment of the present invention. Identical or similar components between the sixth preferred embodiment and the forgoing preferred embodiments are denoted by the same reference sings. Mainly described are different components between these preferred embodiments.

The n⁻-type layer 2 in the sixth preferred embodiment is disposed not only on the n⁻-type-layer-3 side of the p⁻-type anode layer 1, but also on a terminal side of the p⁻-type anode layer 1. An n-type layer 7 is disposed between the n⁻-type layer 2 and the n⁺-type layer 3. A terminal layer 8 is disposed with the n⁻-type layer 2 on the terminal side of the p⁻-type anode layer 1, interposed between the terminal layer 8 and the p⁻-type anode layer 1. The terminal layer 8, similarly to the p⁻-type anode layer 1, has a uniform p-type impurity concentration.

The semiconductor device according to the sixth preferred embodiment is manufactured using a method similar to the method described in the first preferred embodiment. For instance, the semiconductor device is manufactured by forming the n⁻-type layer 2 so as to partly cancel the p⁻-type anode layer 1, and by forming the terminal layer 8 so as to partly cancel the n⁻-type layer 2.

The semiconductor device according to the sixth preferred embodiment achieves an effect similar to that in the first preferred embodiment. The terminal layer 8 in the sixth preferred embodiment enables hole injection in a terminal region to be limited. This enhances the strength of a safety operating area (SOA) during recovery. It is noted that the anode layer and the terminal layer, although being p⁻-type semiconductor layers, may be p-type semiconductor layers.

Seventh Preferred Embodiment

FIG. 9 illustrates the cross-sectional configuration of a semiconductor device according to a seventh preferred embodiment of the present invention. Identical or similar components between the seventh preferred embodiment and the forgoing preferred embodiments are denoted by the same reference sings. Mainly described are different components between these preferred embodiments.

The semiconductor device in the seventh preferred embodiment includes the p type layer 5 (FIG. 5), which is described in the fourth preferred embodiment, in addition to the configuration of the semiconductor device in the sixth preferred embodiment. The semiconductor device according to the seventh preferred embodiment achieves the effect described in the fourth preferred embodiment and the effect described in the sixth preferred embodiment.

Eighth Preferred Embodiment

A power converter according to an eighth preferred embodiment of the present invention includes a main conversion circuit that has the semiconductor device according to any of the first to seventh preferred embodiments. The aforementioned semiconductor device according to any of the first to seventh preferred embodiments, although included in a three-phase inverter in the eighth preferred embodiment, may be included in any power converter.

FIG. 10 is a block diagram of the configuration of a power conversion system including the power converter according to the eighth preferred embodiment.

The power conversion system in FIG. 10 includes a power supply 100, a power converter 200, and a load 300. The power supply 100 is a DC power supply, and supplies DC power to the power converter 200. The power supply 100 may be formed of various types of power supply, such as a DC system, a solar cell, and a storage battery. Alternatively, the power supply 100 may be formed of a rectification circuit connected to an AC system, or of an AC-to-DC converter. Alternatively, the power supply 100 may be formed of a DC-to-DC converter that converts DC power that is output from a DC system into a predetermined power level.

The power converter 200 is a three-phase inverter connected between the power supply 100 and the load 300. The power converter 200 converts the DC power, supplied from the power supply 100, into AC power, and supplies the AC power to the load 300. As illustrated in FIG. 10, the power converter 200 includes the following: a main conversion circuit 201 that converts the DC power into the AC power and outputs the AC power; and a control circuit 203 that outputs a control signal controlling the main conversion circuit 201 to the main conversion circuit 201.

The load 300 is a three-phase electric motor driven by the AC power, supplied from the power converter 200. The load 300 is not limited to a particular intended use. The load 300 is an electric motor installed in various types of electric equipment, and is, for instance, an electric motor intended for a hybrid vehicle, an electric vehicle, a train vehicle, an elevator, or an air-conditioner.

The following details the power converter 200. The main conversion circuit 201 includes a switching element (not shown) and a freewheeling diode (not shown). The main conversion circuit 201 converts the DC power, supplied from the power supply 100, into the AC power in accordance with the switching of the switching element, and supplies the AC power to the load 300. The main conversion circuit 201, to be specific, can have various circuit configurations. In the eighth preferred embodiment, the main conversion circuit 201 is a three-phase, two-level full-bridge circuit, and includes six switching elements and six freewheeling diodes that are reverse-parallel with the respective switching elements. At least one of each switching element and each freewheeling diode of the main conversion circuit 201 is included in a semiconductor module 202 that has the semiconductor device according to any of the first to seventh preferred embodiments. The six switching elements, in pairs, are connected to each other in serial, and constitute sets of upper and lower arms. Each set of upper and lower arms constitutes an individual phase (U-phase, V-phase, or W-phase) of the full-bridge circuit. Moreover, output terminals of the individual sets of upper and lower arms, i.e., three output terminals of the main conversion circuit 201, are connected to the load 300.

The main conversion circuit 201 includes a drive circuit (not shown) that drives each switching element. The drive circuit may be integrated in the semiconductor module 202. Alternatively, the drive circuit may be separated from the semiconductor module 202. The drive circuit generates a drive signal driving the switching elements of the main conversion circuit 201, and supplies the drive signal to control electrodes of the switching elements of the main conversion circuit 201. To be specific, the drive circuit outputs a drive signal that turns on the switching elements and a drive signal that turns off the switching elements to the control electrodes of the individual switching elements in accordance with the control signal from the control circuit 203, which will be described later on. In keeping the switching element ON, the drive signal is a voltage signal (ON signal) equal to or greater than a threshold voltage of the switching element. In keeping the switching element OFF, the drive signal is a voltage signal (OFF signal) equal to or less than the threshold voltage of the switching element.

The control circuit 203 controls the switching elements of the main conversion circuit 201 so that desired power is supplied to the load 300. To be specific, the control circuit 203 calculates, based on power to be supplied to the load 300, a time (ON time) during which each switching element of the main conversion circuit 201 is to be turned on. For instance, the control circuit 203 controls the main conversion circuit 201 through pulse-width-modulation (PWM) control that modulates the ON time of the switching element in accordance with a voltage to be output. Then, the control circuit 203 outputs control commands (control signals) to the drive circuit, which is included in the main conversion circuit 201, in such a manner that at each time point, an ON signal is output to the switching elements to be turned on and an OFF signal is output to the switching elements to be turned off. The drive circuit outputs, as drive signals, the ON signal or OFF signal to the control electrodes of the individual switching elements in accordance with the control signals.

In the power converter according to the eighth preferred embodiment, the semiconductor device according to any of the first to seventh preferred embodiments serves as at least one of the switching elements and freewheeling diodes of the main conversion circuit 201. Such a configuration prevents the peak current during recovery while enhancing the breakdown voltage.

The eighth preferred embodiment has described that the semiconductor device according to any of the first to seventh preferred embodiments included in a three-phase two-level inverter. The eighth preferred embodiment is applicable to various power converters. The semiconductor device according to any of the first to seventh preferred embodiments, although included in a two-level power converter in the eighth preferred embodiment, may be included in a three-level power converter or a multi-level power converter. Alternatively, for power supply to a single-phase load, the semiconductor device may be included in a single-phase inverter. Moreover, for power supply to a DC load or other kinds of load, the semiconductor device can be included in a DC-to-DC converter or an AC-to-DC converter.

In the power converter according to the eighth preferred embodiment, the load is not limited to an electric motor. For instance, the load may be used as a power supply apparatus in an electric discharge machine, a laser beam machine, an induction-heating cooking utensil, or a contactless power-supply system. The load may be further used as a power conditioner in a photovoltaic system, a storage battery system, or other systems.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    an anode layer having a p-type impurity concentration that is uniform;
    a first semiconductor layer having an n-type impurity concentration that is distributed; and
    a second semiconductor layer disposed with the first semiconductor layer interposed between the second semiconductor layer and the anode layer, the second semiconductor layer having an n-type impurity concentration that is higher than that of the first semiconductor layer and is uniform, wherein
    the n-type impurity concentration of the first semiconductor layer in a portion on an anode-layer side is lower than the p-type impurity concentration of the anode layer, and
    the anode layer and the first semiconductor layer form a pn junction closer to a center of the semiconductor device than to an anode layer side of the semiconductor device.

2. The semiconductor device according to claim 1, wherein the n-type impurity concentration of the entire first semiconductor layer is lower than the p-type impurity concentration of the anode layer.

3. The semiconductor device according to claim 1, wherein the n-type impurity concentration of the first semiconductor layer in a portion on a second-semiconductor-layer side is higher than a highest value of the p-type impurity concentration of the anode layer.

4. The semiconductor device according to claim 1, further comprising a third semiconductor layer disposed within the first semiconductor layer, the third semiconductor layer dividing the first semiconductor layer into the portion on the anode-layer side and a portion on a second-semiconductor-layer side, the third semiconductor layer having a p-type impurity concentration that is uniform, wherein
    the p-type impurity concentration of the third semiconductor layer is higher than an n-type impurity concentration of the third semiconductor layer.

5. The semiconductor device according to claim 1, further comprising a third semiconductor layer disposed on the same side of the first semiconductor layer as the second semiconductor layer, the third semiconductor layer having a p-type impurity concentration that is uniform, wherein
    the p-type impurity concentration of the third semiconductor layer is higher than an n-type impurity concentration of the third semiconductor layer.

6. The semiconductor device according to claim 1, further comprising a fourth semiconductor layer disposed on the opposite side of the anode layer from the first semiconductor layer, the fourth semiconductor layer having a p-type impurity concentration that is higher than that of the anode layer and is distributed.

7. The semiconductor device according to claim 1, wherein
    the first semiconductor layer is disposed not only on a second-semiconductor-layer side of the anode layer, but also on a terminal side of the anode layer, and
    the semiconductor device further comprises a terminal layer disposed with the first semiconductor layer on the terminal side of the anode layer, interposed between the terminal layer and the anode layer, the terminal layer having a p-type impurity concentration that is uniform.

8. A power converter comprising:
    a main conversion circuit comprising the semiconductor device according to claim 1, the main conversion circuit being configured to convert power that is input, and to then output the power; and
    a control circuit configured to output a control signal controlling the main conversion circuit to the main conversion circuit.

9. A semiconductor device comprising:
    an anode layer having a p-type impurity concentration that is uniform;
    a first semiconductor layer having an n-type impurity concentration that is distributed; and
    a second semiconductor layer disposed with the first semiconductor layer interposed between the second semiconductor layer and the anode layer, the second semiconductor layer having an n-type impurity concentration that is higher than that of the first semiconductor layer and is uniform, wherein
    the n-type impurity concentration of the first semiconductor layer in a portion on an anode-layer side is lower than the p-type impurity concentration of the anode layer, and
    the p-type impurity concentration of the anode layer is $1\times10^{12}$ cm$^{-3}$ to $1\times10^{14}$ cm$^{-3}$.

10. The semiconductor device according to claim 9, wherein the n-type impurity concentration of the first semiconductor layer in a portion on a second-semiconductor-layer side is higher than a highest value of the p-type impurity concentration of the anode layer.

11. The semiconductor device according to claim 9, further comprising a third semiconductor layer disposed within the first semiconductor layer, the third semiconductor layer dividing the first semiconductor layer into the portion on the anode-layer side and a portion on a second-semiconductor-layer side, the third semiconductor layer having a p-type impurity concentration that is uniform, wherein
    the p-type impurity concentration of the third semiconductor layer is higher than an n-type impurity concentration of the third semiconductor layer.

12. The semiconductor device according to claim 9, further comprising a third semiconductor layer disposed on the same side of the first semiconductor layer as the second semiconductor layer, the third semiconductor layer having a p-type impurity concentration that is uniform, wherein
    the p-type impurity concentration of the third semiconductor layer is higher than an n-type impurity concentration of the third semiconductor layer.

* * * * *